United States Patent [19]

Ono et al.

[11] 4,223,286
[45] Sep. 16, 1980

[54] SURFACE ACOUSTIC WAVE RESONATOR

[75] Inventors: Shusuke Ono, Takatsuki; Kenzo Ohji, Hirakata; Osamu Yamazaki, Suita; Kiyotaka Wasa, Nara, all of Japan

[73] Assignee: Matsushita Electric Industrial Co., Ltd., Kadoma, Japan

[21] Appl. No.: 940,510

[22] Filed: Sep. 5, 1978

[30] Foreign Application Priority Data

Sep. 5, 1977 [JP] Japan .................. 52/107018

[51] Int. Cl.$^2$ .................. H03H 9/20; H03H 9/32; H01L 41/10; H01L 41/18
[52] U.S. Cl. .................. 333/195; 310/313 A; 333/196
[58] Field of Search .................. 333/150-155, 333/193-196; 331/107 A; 310/313; 330/5.5; 364/821; 29/25, 35

[56] References Cited

U.S. PATENT DOCUMENTS

| | | | |
|---|---|---|---|
| 3,598,619 | 4/1969 | Mikoda et al. | 333/150 X |
| 3,687,697 | 8/1972 | Faulstich et al. | 333/155 X |
| 3,961,293 | 6/1976 | Hartmann et al. | 333/195 |
| 3,970,970 | 7/1976 | Worley | 333/195 |
| 4,037,176 | 7/1977 | Ono et al. | 333/155 |
| 4,144,507 | 3/1979 | Shreve | 333/153 X |

OTHER PUBLICATIONS

Evans et al., "Sputtered ZnO Surface Wave Transducers," in Electronics Letters, vol. 7, No. 18, Sep. 9, 1971; pp. 957-958.

Bell, Jr. et al., "Surface Acoustic Wave Resonators," in Proceedings of the IEEE, vol. 64, No. 5, May 1976; pp. 711-715.

*Primary Examiner*—Marvin L. Nussbaum
*Attorney, Agent, or Firm*—Wenderoth, Lind & Ponack

[57] ABSTRACT

A surface acoustic wave resonator includes a base plate made of glass and a layer of piezoelectric material which has a plurality of strips extending parallel to each other for forming a reflector. A surface acoustic wave excited from a transducer reflects at each of the strips. The reflectance of such surface acoustic wave is improved by the arrangement of the strips and the thickness of the layer. On the other hand, the temperature coefficient of the resonance frequency is also improved by the arrangement of the strips and the thickness of the layer, and by the amount of the alkali metal oxide contained in the base plate, and further by the thickness of silicon oxide film laminated on the surface of the base plate.

8 Claims, 15 Drawing Figures

SURFACE ACOUSTIC WAVE RESONATOR

BACKGROUND OF THE INVENTION

The present invention relates to a surface acoustic wave resonator and, more particularly, to an assembly of a surface acoustic wave resonator having arrays of electrodes and reflectors made of piezoelectric material provided on a base plate made of non-piezoelectric material.

Conventionally, there have been proposed various types of surface acoustic wave resonators, and one example is shown in FIG. 1. As illustrated in FIG. 1 in a perspective view, a conventional surface acoustic wave resonator includes a base plate 13, interleaved electrodes 11 disposed on base plate 13 for the excitation and for receiving the surface acoustic wave, and a pair of reflection strip arrays 12a and 12b also disposed on the base plate 13 enclosing the interleaved electrodes 11 for reflecting the excited surface acoustic wave. In the conventional surface acoustic wave resonator, the base plate is generally made of a single-crystal piezoelectric material such as LiNbO$_3$ or quartz. In the case where the base plate is made of LiNbO$_3$, there has been a disadvantage that the resonance frequency is not stable with respect to temperature change. A base plate made of quartz provides a stable resonance frequency with respect to temperature change. However, for propagating the surface acoustic wave having a predetermined frequency, it is necessary to select an appropriate quartz which has a particular crystal structure from the view point of crystal face and crystallographic axis.

In general, the material which constitutes the base plate is piezoelectric material and, for the purpose of obtaining a resonator having a high quality, it is necessary to select a base plate having a high quality.

SUMMARY OF THE INVENTION

Accordingly, a primary object of the present invention is to provide an improved surface acoustic wave resonator which provides a high quality, particularly with respect to the temperature characteristic, by the employment of base plate made of non-piezoelectric material.

A further object of the present invention is to provide an improved surface acoustic wave resonator of the above described type which has a simple construction and can readily be manufactured at low cost.

In accomplishing these and other objects, there has been provided, in accordance with the present invention, an improved surface acoustic wave resonator which comprises a base plate made of non-piezoelectric material, a first layer of piezoelectric material bonded on one flat surface of the base plate, and a pair of elongated electrodes supported on the base plate within said first layer. The elongated electrodes are arranged in parallel to each other so as to form a transducer thereat. The surface acoustic wave resonator further comprises a plurality of strips of piezoelectric material supported on the base plate. The strips are arranged in parallel to the elongated electrodes while each two adjacent strips are spaced a predetermined distance so as to form a reflector thereat.

BRIEF DESCRIPTION OF THE DRAWINGS

These and other objects and features of the present invention will become apparent from the following description taken in conjunction with a preferred embodiments thereof with reference to the accompanying drawings, in which.

DETAILED DESCRIPTION OF THE INVENTION

Figure 1:
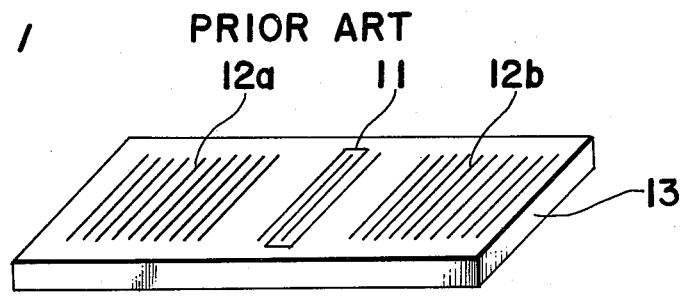
FIG. 1 is a perspective view of a surface acoustic wave resonator according to the prior art.
Figure 2:
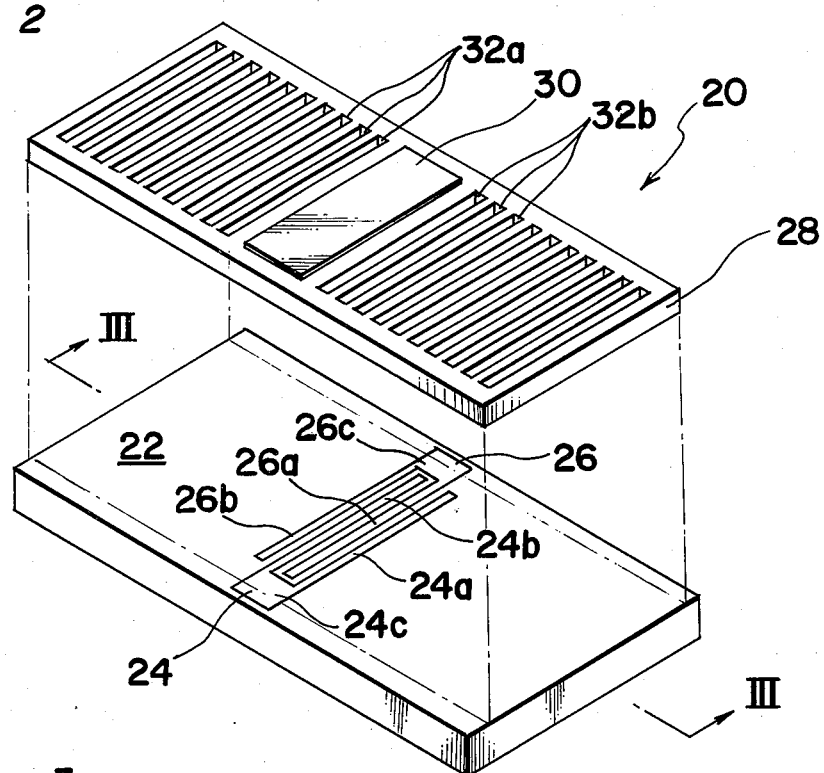
FIG. 2 is an exploded perspective view of a surface acoustic wave resonator of the present invention.

Referring to FIG. 2, there is shown one embodiment of a surface acoustic wave resonator 20 of an energy trapped type which comprises a base plate 22 made of non-piezoelectric material such as glass and having a rectangular shape and a pair of electrodes 24 and 26 bonded at a substantially central portion of and on one flat surface of the base plate 22. Each of the electrodes 24 and 26 has one or more elongated teeth, for example, two teeth 24a and 24b or 26a and 26b as shown in FIG. 2, extending in parallel to each other from respective body portions (24c and 26c). The teeth of the electrodes 24 and 26 are interleaved with each other, the neighboring teeth, which are spaced a predetermined distance from each other, belonging to the different electrodes 24 and 26 of the pair.

A layer 28 is piezoelectric material such as zinc oxide or cadmium sulfide having a rectangular shape is bonded on the one flat surface of the base plate 22. It is preferable to align the crystallographic C-axis of the zinc oxide in a direction perpendicular to the flat surface of the base plate 22. Since the width of the layer 28 is slightly less than that of the base plate 22, the opposite side edge portions of the base plate 22 are uncovered, when the layer 28 is mounted on the plate 22, for allowing external electric connection to the body portions 24c and 26c of the electrodes 24 and 26. A counter electrode 30 is bonded on the upper surface of the layer 28 at a position above the interleaved electrodes 24 and 26. On the upper surface of the layer 28 and on respective sides of the counter electrode 30, there are formed two groups 32a and 32b of elongated grooves extending in parallel relation to each other and each of said grooves of the groups having a rectangular cross-section. The neighboring two grooves of each group 32a or 32b define between them a strip 33 of piezoelectric material, which strip 33 serves as a part of the resonator.

Figure 3:
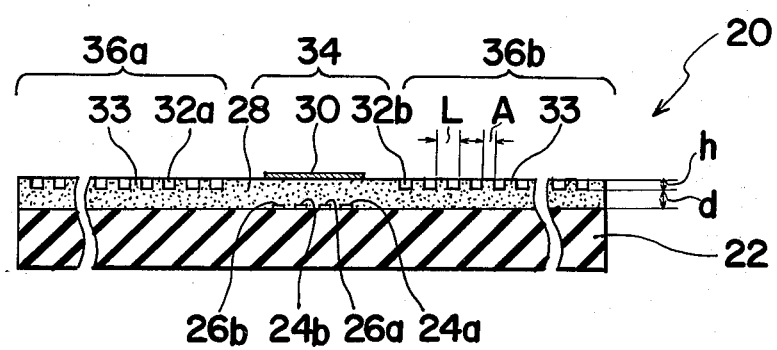
FIG. 3 is a cross-sectional view taken along the line III—III in FIG. 2 in which the component elements are combined.

When the base plate 22 and the layer 28 are bonded together, as best shown in FIG. 3, a section 34 including the interleaved electrodes 24 and 26 and the counter electrode 30 constitutes a transducer of the surface acoustic wave resonator 20 while sections 36a and 36b positioned on respective sides of the section 34 and including the groove groups 32a and 32b, respectively, constitute reflectors. The counter electrode 30 is provided for improving the coupling coefficient in the transducer, that is, for effectively transducing electric energy to mechanical energy.

When a signal is applied across the interleaved electrodes 24 and 26, surface acoustic waves are excited in the section 34, particularly at high amplitude around the teeth of the electrodes 24 and 26. Such excited surface acoustic waves are propagated along the surface of the base plate 22 towards and then reflected by the opposed reflectors 36a and 36b. The reflected waves are combined with the waves subsequently excited from the transducer or section 34 to establish a standing wave approximately under the section 34.

The surface acoustic wave resonator thus constructed can be evaluated by various factors, but the most important factors are the quality of the reflectors and the temperature coefficient of the resonance frequency. First, the quality of the reflectors is described hereinbelow.

The quality of the reflectors can be determined by a ratio $\alpha$ of the amplitude of the reflected surface acoustic wave to that of the incident surface acoustic wave in each of the strips 33 formed between the neighboring grooves of all groups. Such ratio $\alpha$ is hereinafter referred to as the reflectance $\alpha$. The same quality can also be determined by ratio $\gamma$ of the power propagated by a bulk wave to the total power propagated by the incident surface acoustic wave. Such ratio $\gamma$ is hereinafter referred to as the power conversion ratio $\gamma$. Since the number N of the strips 33 provided in each of the reflectors 36a and 36b is determined by the relation $N \geq 1/\alpha$, it will be understood that the number N of the strips 33 decreases as the reflectance $\alpha$ increases. Thus, an increase in the amount of the reflectance $\alpha$ reduces the size of the resonator. Also, since a smaller value of the power conversion ratio $\gamma$ results in a smaller bulk scattering loss, it will understood that a decrease in the value of the power conversion ratio $\gamma$ increases the quality factor Q of the resonator. Therefore, a reflector having a larger value of the reflectance $\alpha$ and a small value of the conversion ratio $\gamma$ is a high quality resonator. The manner in which the reflectance $\alpha$ and the power conversion ratio $\gamma$ are improved is described hereinbelow.

It has been found by the present inventors that the value of the reflectance $\alpha$ and of the power conversion ratio $\gamma$ of the surface acoustic wave resonator 20 shown in FIGS. 2 and 3 can be given by the following equations:

$$\alpha = \alpha_0 \cdot (h/L) \cdot \sin(\pi A/L) \quad (1)$$

$$\gamma = \gamma_0 \cdot (h/L)^2 \cdot \{\sin(\pi A/L)\}^2 \quad (2)$$

wherein A is the width of each two strip 33, L is the pitch of each adjacent strips 33, h is the height of the strip 33 or depth of the groove, and $\alpha_0$ and $\gamma_0$ are constants determined by the density and elastic coefficient of the material constituting the strips 33 and base plate 22. According to the tests carried out by the present inventors, it has been found that, depending on the material of the base plate 22 and the layer 28, the value of the constants $\alpha_0$ and $\gamma_0$ range as follows:

$$\alpha_0 = 0.5 \pm 0.3$$

$$\gamma_0 = 6 \pm 4$$

According to the embodiment, the resonator 20 shown in FIGS. 2 and 3 has values $\alpha_0 = 0.2$ and $\gamma_0 = 2$, provided that the material employed for the base plate 22 is glass and the material employed for the layer 28 is zinc oxide having the C-axis oriented perpendicularly to the flat surface of the base plate 22 and that the thickness d of the layer 28 measured from the bottom of the groove is equal to or larger than 0.5 L. In the case where the thickness d is smaller than 0.5 L and larger than zero, the constant $\alpha_0$ ranged between 0.2 and 0.8 while the constant $\gamma_0$ ranged between 2 and 10.

From the above equations (1) and (2), the maximum reflectance $\alpha$, referred to as reflectance $\alpha_{max}$, is obtained when $A/L = 0.5$. It is considered that an acceptable limit of the reflectance $\alpha$ is 70% of the maximum reflectance $\alpha_{max}$. Accordingly, the acceptable reflectance $\alpha$, which is equal to or more than $0.7\alpha_{max}$ is within a range of $0.25 < A/L < 0.75$. In other words, the reflectors 36a and 36b having $A/L < 0.25$ or $A/L > 0.75$ are not appropriate for use as a surface acoustic wave resonator of the present invention since their reflectance $\alpha$ is smaller than $0.7\alpha_{max}$. On the other hand, when $h/L < 0.002$, the reflectance $\alpha$ falls below 0.001, requiring the number N of the strips 33 to be more than 1,000. Thus, the size of the reflectors 36a and 36b may become undesirably large. When $h/L > 0.1$, the power loss caused by the bulk scattering becomes 2 to 10% or more, thereby undesirably reducing the quality factor Q of the surface acoustic wave resonator. Therefore, it is preferable to arrange the strips 33 or grooves 32a and 32b of the reflectors 36a and 36b to satisfy the relations $0.25 < A/L < 0.75$ and $0.002 < h/L < 0.1$ for obtaining a surface acoustic wave resonator having a high Q value and which is compact in size.

Next, the surface acoustic wave resonator of the present invention is evaluated from the view point of temperature coefficient of the resonance frequency. The resonance frequency f and the temperature coefficient $\phi = (1/f)(df/dT)$ of the surface acoustic wave resonator 20 shown in FIGS. 2 and 3 can be given by the following equations:

$$f = \frac{1}{2L}\{(1 - \frac{A}{L})V_1 + \frac{A}{L}V_2\} \quad (3)$$

$$\phi = \frac{1}{f}\frac{df}{dT} = (1 - \frac{A}{L})\frac{1}{V_1}\frac{dV_1}{dT} + \frac{A}{L}\frac{1}{V_2}\frac{dV_2}{dT} - \beta \quad (4)$$

wherein T is the absolute temperature, $\beta$ is the thermal expansion coefficient of the base plate 22, $V_1$ is the velocity of a particular surface acoustic wave propagated over the base plate 22 where the layer 28 has the thickness d, and $V_2$ is the velocity of the particular surface acoustic wave propagated over the base plate 22 where the layer 28 has the thickness $h + d$. Since the velocity $V_1$ is determined by the thickness d whereas the velocity $V_2$ is determined by the thickness $d + h$, the desired resonance frequency f can simply be obtained by adjusting the value d and/or h. The temperature coefficient $\phi$ can be fixed at zero by adjusting the value A/L and/or $V_1$ and $V_2$ so as to satisfy the following equation:

$$(1 - \frac{A}{L})\frac{1}{V_1}\frac{dV_1}{dT} + \frac{A}{L}\frac{1}{V_2}\frac{dV_2}{dT} = \beta$$

Therefore, by chosing an appropriate combination of the values A/L, $V_1$ and $V_2$, it is possible to present a resonator which has a zero temperature coefficient at a desired resonance frequency.

Figure 4:
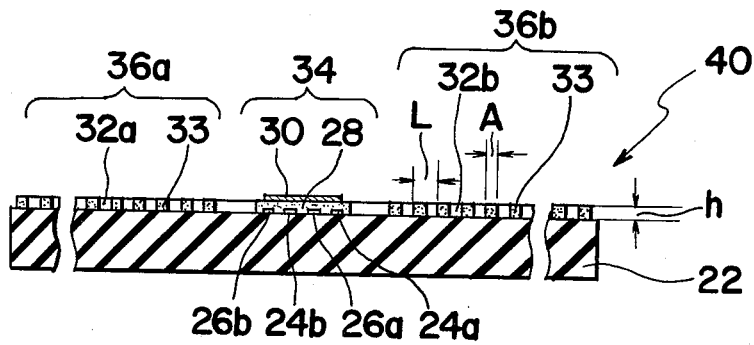
FIG. 4 is a view similar to FIG. 3, but particularly showing another embodiment thereof.
Figure 5:
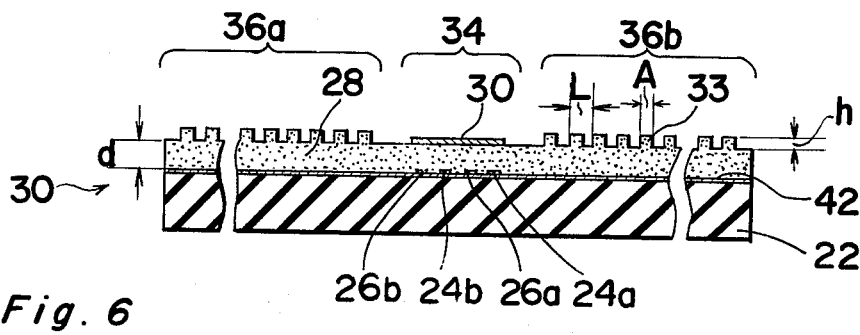
FIG. 5 is a view similar to FIG. 3, but particularly showing a modification thereof.

Although the foregoing description is particularly directed to the surface acoustic wave resonator 20 shown in FIGS. 2 and 3, the above relation can equally apply to resonators of the other embodiments such as shown in FIGS. 4 and 5.

Referring to FIG. 4, there is shown a surface acoustic wave resonator 40 which is another embodiment of the present invention. In this embodiment, the layer 28 has grooves 32a and 32b which extend completely through the thickness of the layer 28. In this embodiment, the reflectance $\alpha$ and the conversion ratio $\gamma$ of the resonator 40 can also be given by the equations (1) and (2). In this embodiment, the constants $\alpha_0$ and $\gamma_0$ have the following values: $\alpha_0=0.8$ and $\gamma_0=10$, provided that the material employed for the base plate is glass and the material employed for the layer 28 is zinc oxide having the C-axis oriented perpendicularly to the flat surface of the base plate 22.

The foregoing relation can also apply to the case where the material employed for the layer 28 including the strips 33 is cadmium sulfide instead of zinc oxide. Moreover, it has been found that each of the constants $\alpha_0$ and $\gamma_0$ has substantially the same value when the C-axis of the zinc oxide deviates within 10 degrees with respect to the normal direction of the flat surface of the base plate 22. In other words, the angle of orientation of the crystallographic C-axis of the zinc oxide may deviate within 10° from a direction perpendicular to the flat surface of the base plate 22.

According to a further investigation, it has been found that the temperature coefficient $\phi = (1/f)(df/dT)$ of the surface acoustic wave resonator is dependent on the amount of alkali metal oxide contained in the base plate 22, or on the silicon oxide layer 42 spread over the base plate 22, as shown in FIG. 5. First, the relation between the temperature coefficient $\phi$ and the amount of alkali metal oxide contained in the base plate 22 is described hereinbelow.

Since the first two terms in the equation (4) are substantially equal to the rate $\sigma$ of change in average velocity V of the surface acoustic wave with respect to the temperature change, the following equation can be obtained.

$$\sigma = \frac{1}{V}\frac{dV}{dT} = (1 - \frac{A}{L})\frac{1}{V_1}\frac{dV_1}{dT} + \frac{A}{L}\frac{1}{V_2}\frac{dV_2}{dT}$$

Figure 6:
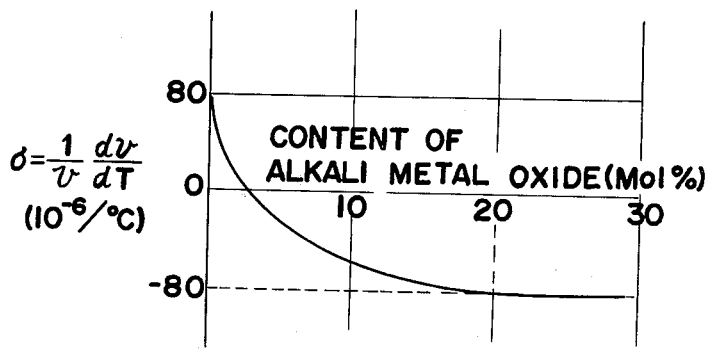
FIG. 6 is the graph showing a relation between the rate of change in average velocity of the surface acoustic wave with respect to the temperature change and the content of alkali metal oxide.

As shown in FIG. 6, the rate $\sigma$ changes with a change in the amount of alkali metal oxide in the glass base plate 22. As is apparent from the graph of FIG. 6, the rate $\sigma$ is approximately $+80 \times 10^{-6}/°C$. when the glass base plate 22 contains no alkali metal oxide. In accordance with the increase of the amount of the alkali metal oxide, the rate $\sigma$ gradually decreases. When the glass base plate 22 contains approximately 3 mol% of alkali metal oxide, the rate $\sigma$ will be zero. A further increase of the alkali metal oxide decreases the rate $\sigma$ which saturates at a value of $-80 \times 10^{-6}/°C$. when the amount of alkali metal oxide reaches 20 mol%.

Since the thermal expansion coefficient $\beta$ of the glass is about $10 \times 10^{-6}/°C$., the temperature coefficient $\phi$ can be varied between $+70 \times 10^{-6}/°C$. and $-90 \times 10^{-6}/°C$. by changing the amount of the alkali metal oxide to a value below 20 mol%. As a particular case, it is possible to provide a surface acoustic wave resonator having a substantially zero temperature coefficient $\phi$. In addition to the alkali metal oxide, the glass base plate 22 contains about 65 mol% of $SiO_2$, and $B_2O_3$, $Al_2O_3$.

As described above, the base plate made of glass involves such advantages that the temperature coefficient $\phi$ can be simply adjusted and that the manufacturing cost therefor is comparatively low since the glass containing $SiO_2$ as a main component and 20 or less mol% of alkali metal oxide is available at low cost and is easy to work on.

Next, the relation between the temperature coefficient $\phi$ and the thickness of the silicon oxide layer 42 (FIG. 5) provided on the upper surface of the base plate 22 will be described hereinbelow.

Figure 7:
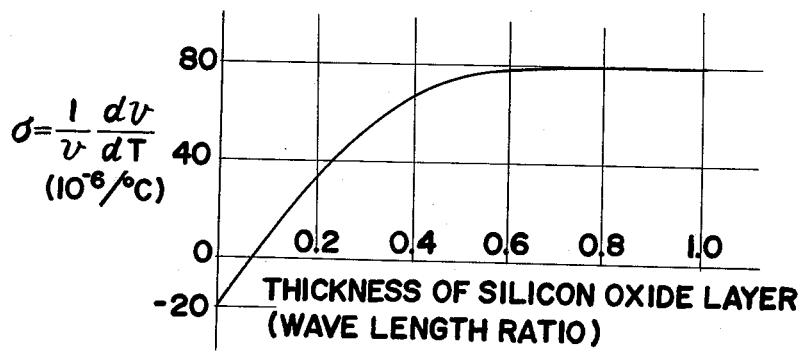
FIG. 7 is the graph showing a relation between the rate of change in average velocity of the surface acoustic wave with respect to the temperature change and the thickness of the silicon oxide layer laminated directly on the base plate.

As shown in FIG. 7, the rate $\sigma$ described above changes with change of the thickness of the silicon oxide layer 42. In FIG. 7, the thickness of the silicon oxide layer 42 is expressed by a ratio $\theta$ of the wavelength of a particular surface acoustic wave propagating over the base plate to the thickness of the layer 42. The curve in this graph is obtained from a surface acoustic wave propagated in a [100] direction over a (011) surface of a single crystal of silicon. As is apparent from the graph, the rate $\sigma$ is approximately $-20 \times 10^{-6}/°C$. when there is no silicon oxide laminated over the base plate 22. With an increase in the thickness of the silicon oxide layer 42, the rate $\sigma$ gradually increases. When the thickness ratio $\theta$ increases to approximately 0.08, the rate $\sigma$ will be zero. A further increases in the thickness ratio $\theta$ increase the rate $\sigma$ which saturates at a value of $+80 \times 10^{-6}/°C$. when the ratio $\theta$ reaches 0.6.

As is apparent from the foregoing, the temperature coefficient $\phi$ of the resonance frequency can be varied to a desired amount by changing the thickness of the silicon oxide layer 42 provided on the base plate 22. It has been found by the present inventors that the above result is obtained even when the surface acoustic wave is propagated in a direction other than the [100] direction and over a surface other than the (011) surface of the single crystal of silicon, or when the surface acoustic wave is propagated over a poly-crystalline silicon.

In addition to the advantage of simple control of the temperature coefficient $\phi$ of the resonance frequency, the presence of silicon oxide layer 52 under the layer 28 of piezoelectric material has the advantage that the layer 28 can be directly mounted on the base plate of a printed circuit where the base plate is made of silicon.

Figure 8:
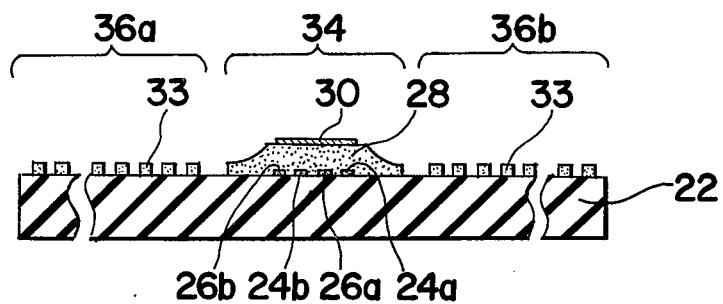
FIG. 8 is a view similar to FIG. 4, but particularly showing a modification thereof.

Referring to FIG. 8, there is shown a modification of a surface acoustic wave resonator of the present invention in which the layer 28 of piezoelectric material is thicker at the section 34 where the transducer is defined than at the sections 32a and 32b where the reflectors are respectively defined.

Figure 9:
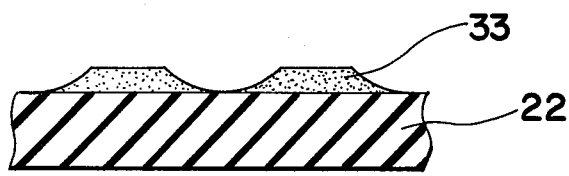
FIGS. 9 and 10 are fragmentary sectional views, particularly showing modifications of strips.
Figure 10:
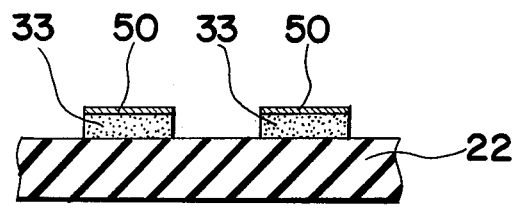

Although the present invention has been fully described by way of examples with reference to the accompanying drawings, it is to be noted that various changes and modifications will be apparent to those skilled in the art. For example, in the reflectors, each of the grooves 32a and 32b which has been described as having a rectangular cross-sectional shape can have an arcuate cross-section as shown in FIG. 9, or each of the strips 33 can have a metallic film 50 laminated on the upper surface thereof, as shown in FIG. 10. The films 50 provided on the strips included in each reflector 36a or 36b can be electrically connected to each other.

Figure 11:
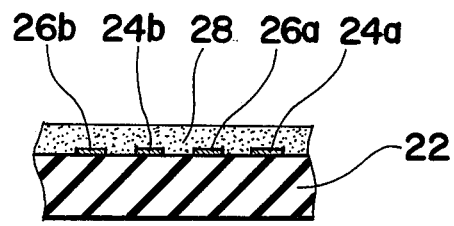
FIGS. 11, 12 and 13 are fragmentary sectional views, particularly showing modifications of the transducer.
Figure 12:
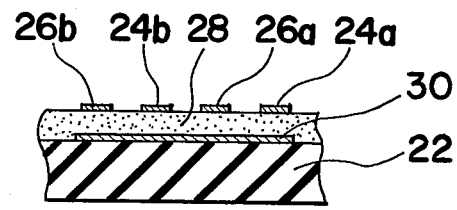
Figure 13:
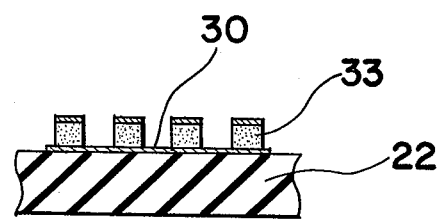

Furthermore, in the transducer, the counter electrode 30 may be eliminated, as shown in FIG. 11, or may be provided under the layer 28, provided that the interleaved electrodes 24 and 26 are placed on the top of the layer 28, as shown in FIG. 12. In this case, the piezoelectric material between the teeth of the interleaved electrodes may be removed, as shown in FIG. 13.

Figure 14:
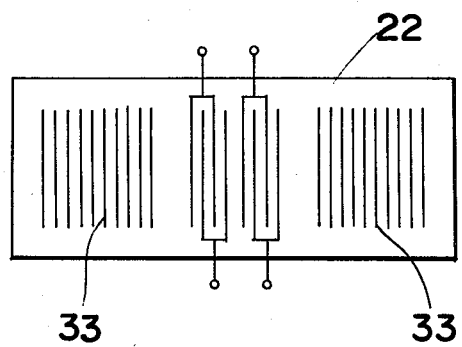
FIGS. 14 and 15 are top plan views of other embodiments showing different arrangements.

Moreover, it is possible to provide two sets of transducers between the pair of reflectors, as shown in FIG. 14, in which case one of the transducers operates to excite the surface acoustic wave and the other operates to receive the reflected wave.

Figure 15:
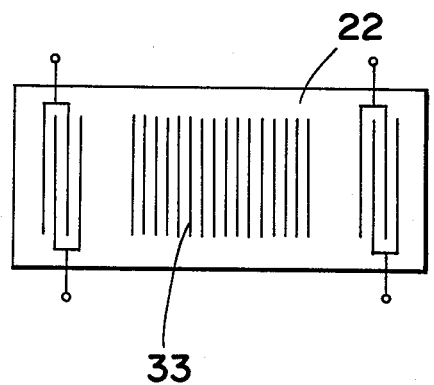

Although the arrangements described above are all directed to energy trapped type resonators, it is possible to form a narrow band filter by positioning one reflector between a pair of transducers, as shown in FIG. 15.

Although the layer 28 has been described as having the grooves 32a and 32b which extend either halfway or completely through the thickness of the layer while providing the strips 33 one positioned between each two adjacent grooves of each group, the strips and the grooves may be formed by placing a number of rods or like elongated members of piezoelectric material on a flat surface of the layer 28, as shown in FIG. 5.

Therefore, such changes and modifications are, unless they depart from the true scope of the present invention, to be understood as being included therein.

We claim:

1. A surface acoustic wave resonator comprising:
a base plate made of non-piezoelectric material;
a first layer of piezoelectric material bonded on one flat surface of the base plate;
a pair of elongated electrodes provided on a surface of said first layer which is opposite to the surface facing said base plate, said elongated electrodes being positioned parallel to each other;
a plurality of strips of piezoelectric material supported on the base plate, said strips extending parallel to each other and also to the elongated electrodes, each two adjacent strips being spaced a predetermined distance from each other, said strips satisfying the equation:

$$(1 - \frac{A}{L}) \frac{1}{V_1} \frac{dV_1}{dT} + \frac{A}{L} \frac{1}{V_2} \frac{dV_2}{dT} = \beta$$

wherein A is the width of each strip, L is the pitch of each two adjacent strips, $V_1$ is the velocity of a predetermined surface acoustic wave propagated over the base plate where the base plate is provided with no strips, $V_2$ is the velocity of the predetermined surface acoustic wave propagated over the base plate where the base plate is provided with strips, T is the absolute temperature, and $\beta$ is the thermal expansion coefficient of the base plate, for giving to said resonator a zero temperature coefficient $\phi$ of resonance frequency which is according to the equation:

$$\phi = (1 - \frac{A}{L}) \frac{1}{V_1} \frac{dV_1}{dT} + \frac{A}{L} \frac{1}{V_2} \frac{dV_2}{dT} - \beta$$

2. A surface acoustic wave resonator as claimed in claim 1, wherein said values A and L satisfy the equations:

$$0.25 < A/L < 0.75$$

$$0.002 < h/L < 0.1$$

wherein h is the height of the strip perpendicular to the surface of said base plate.

3. A surface acoustic wave resonator as claimed in claim 1, wherein the piezoelectric material is zinc oxide and the angle of orientation of the crystallographic C-axis of the zinc oxide is within 10° of a perpendicular to the flat surface of the base plate, and said base plate is glass having $SiO_2$ as a major component and having alkali metal oxide in an amount less than 20 mol%.

4. A surface acoustic wave resonator as claimed in claim 1, further comprising a counter electrode sandwiched between said first layer and said base plate.

5. A surface acoustic wave resonator as claimed in claim 1, further comprising a second layer of piezoelectric material provided between the base plate and the plurality of strips.

6. A surface acoustic wave resonator as claimed in claim 5, wherein said values satisfy the equations:

$$0.25 < A/L < 0.75$$

$$0.002 < H/L < 0.1$$

wherein h is the height of the strip perpendicular to the surface of said base plate.

7. A surface acoustic wave resonator as claimed in claim 5, wherein the piezoelectric material is zinc oxide and the angle of orientation of the crystallographic C-axis of the zinc oxide is within 10° of a perpendicular to the flat surface of the base plate, and said base plate is glass having $SiO_2$ as a major component and having alkali metal oxide in an amount less than 20 %.

8. A surface acoustic wave resonator as claimed in claim 5, further comprising a counter electrode sandwiched between said second layer and said base plate.

* * * * *